(12) United States Patent
Saldanha et al.

(10) Patent No.: US 7,013,438 B1
(45) Date of Patent: Mar. 14, 2006

(54) SYSTEM CHIP SYNTHESIS

(75) Inventors: Alexander Saldanha, El Cerrito, CA (US); Joe Higgins, Albany, CA (US); Amit Mehrotra, Urbana, IL (US)

(73) Assignee: Cadence Design Systems, Inc., San Jose, CA (US)

( * ) Notice: Subject to any disclaimer, the term of this patent is extended or adjusted under 35 U.S.C. 154(b) by 445 days.

(21) Appl. No.: 10/002,034

(22) Filed: Nov. 1, 2001

Related U.S. Application Data

(60) Provisional application No. 60/245,334, filed on Nov. 1, 2000.

(51) Int. Cl.
*G06F 17/50* (2006.01)

(52) U.S. Cl. ............................................. 716/2; 716/18
(58) Field of Classification Search .................... 716/2, 716/4–14, 17–18; 326/39–41
See application file for complete search history.

(56) References Cited

U.S. PATENT DOCUMENTS

| | | | | |
|---|---|---|---|---|
| 5,870,310 A * | 2/1999 | Malladi | ....................... | 716/19 |
| 5,946,477 A * | 8/1999 | Ito | ................................. | 716/9 |
| 6,084,429 A * | 7/2000 | Trimberger | .................. | 326/41 |
| 6,189,131 B1 * | 2/2001 | Graef et al. | .................... | 716/8 |
| 6,205,572 B1 * | 3/2001 | Dupenloup | ..................... | 716/5 |
| 6,230,304 B1 * | 5/2001 | Groeneveld et al. | ........... | 716/7 |
| 6,286,128 B1 * | 9/2001 | Pileggi et al. | ................. | 716/18 |
| 6,360,356 B1 * | 3/2002 | Eng | ............................ | 716/18 |
| 6,378,123 B1 * | 4/2002 | Dupenloup | .................. | 716/18 |
| 6,421,818 B1 * | 7/2002 | Dupenloup et al. | ........... | 716/18 |
| 6,490,707 B1 * | 12/2002 | Baxter | ............................ | 716/2 |
| 6,622,291 B1 * | 9/2003 | Ginetti | .......................... | 716/9 |
| 6,684,373 B1 * | 1/2004 | Bodine et al. | .................. | 716/6 |
| 2002/0178432 A1 * | 11/2002 | Kim et al. | ..................... | 716/18 |

* cited by examiner

*Primary Examiner*—Matthew Smith
*Assistant Examiner*—Naum Levin
(74) *Attorney, Agent, or Firm*—John Carpenter; ReedSmith, LLP

(57) ABSTRACT

A technique to design deep sub-micron (DSM) integrated circuits is disclosed, in which global wire delays are minimized first, before performing logic synthesis. According to the present method, a designer performs layout of physical blocks by estimating an area for each block. After connecting the pins of the blocks with no timing constraints, each wire is assigned to a metal layer, based on length. The delay of each wire is minimized by inserting buffers at optimal distances. The blocks are then partitioned into "cores" and "shells." The shells and cores are synthesized, and then recombined. This procedure greatly reduces the number of design iterations required to complete a design.

23 Claims, 8 Drawing Sheets

SYSTEM CHIP SYNTHESIS

CROSS REFERENCE TO RELATED APPLICATIONS AND CLAIM OF PRIORITY

This application claims priority to U.S. Provisional Application Ser. No. 60/245,334 entitled "SYSTEM CHIP SYNTHESIS," filed Nov. 1, 2000, the contents of which are incorporated herein by reference in their entirety. Furthermore, this application is related to U.S. patent application Ser. No. 09/919,740, entitled "INSERTION OF REPEATER WITHOUT TIMING CONSTRAINT" filed Aug. 1, 2001, the contents of which are incorporated herein by reference in their entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates generally to the field of integrated circuit synthesis, and more particularly to a method for designing and implementing deep sub-micron integrated circuits.

2. Discussion of Background

The Semiconductor Industry Association's (SIA) 1997 National Technology Roadmap for Semiconductors (NTRS) (www.scmichips.org) looked at the challenges the semiconductor industry would have to overcome in order to sustain the rapid technology development it has enjoyed in the past several years. The NTRS report concluded that the industry is rapidly approaching a formidable "100 nm barrier" that threatens the continuation of the historical success the industry has enjoyed. The most alarming finding of this working group was that the industry has become very "idea limited," and almost all areas of design technology would hit a brick wall by the year 2006, when the industry anticipates the first shipment of 100 nm technology.

Before any revolutionary solutions are available to combat this crisis, innovations are still required to solve the immediate problems of keeping up with the requirements till the year 2006. The NTRS predicts that overall design productivity has to improve by about 10% every year, overall design cycle times have to improve by 25% every year, 60% of the design content will need to be reusable, and that synthesis and physical design need to be coupled (including asynchronous logic).

The Gigascale Silicon Research Center (GSRC, www.gigascale.org), a center funded by SIA/SEMATECH to conduct potentially long-lead research into this problem, categorized the problems identified in the 1997 NTRS as:

Problems of the Small: issues related to small device geometry and the evolving role of interconnect and communication among devices and subsystems Problems of the Large: related to the large systems that go on a chip, including design, verification and testing of large systems Problems of the Diverse: Issues related to the diversity of subsystems on a chip, including digital, analog. RF and memory devices.

Many tools have been created to address the various issues that need to be solved in order to overcome the nano-metric challenge. These include the Epsilon project (Sophia R&D group), the PKS product (Ambit group), QPOpt/PBOpt family of transformations (DSM group), the Signal Integrity initiatives in SE/Ultra and various other design and verification initiatives.

However, it has become very clear that even if the various components of a design automation toolset could handle specific issues in their respective domain, the overall problems of size, diversity and productivity may not he solved unless a coherent and comprehensive approach to tools working together in a convergent flow is taken.

Also, for "deep sub-micron" (DSM) manufacturing processes (i.e. those less than or equal to 0.18 micron), the problem of wire delay becomes a significant issue. Prior to DSM, most of the delay on a chip was due to the logic gates, and the delay associated with the wires was relatively insignificant. However, for 0.18 micron processes, the delay of the wires is at least equal to the delay in the gates, and at 0.13 micron technology, the wire delay becomes dominant. This is a significant paradigm shift and requires a new design methodology in order to properly address the new issues raised. Further complicating 0.13 micron design, is that there are now 6 metal layers (horizontal and vertical pairs which produce three different wire levels) in which to route the wires. Each layer has a different thickness, resulting in wires of different maximum speeds (fast, medium and slow). Thus, a designer must now also decide which wire layer is appropriate for each wire.

The problem of wire delay dominance can cause serious problems for standard prior art design techniques. Using traditional techniques, integrated circuits (hereinafter "chips") are generally designed using logic blocks (modules) comprising 10,000–50,000 gates. Modern designs having 10 million or more transistors are simply too large for current design tools to handle, so the designs are broken down in manageable blocks. A design is created using an RTL (register transfer level) design tool such as Verilog or VHDL. This describes the design in terms of functionality at cycle boundaries. The design is then synthesized and the logic optimized for each logic block (local optimization). Finally, the design is physically synthesized, which is the first time that the whole chip is considered. The physical synthesis process comprises actually placing the blocks and routing the wires.

Each stage (RTL, logic synthesis, physical synthesis) generally takes several weeks. After the process is complete, certain wires will be too long (i.e. too much delay), so the whole process must be repeated. However, as a result of the re-design some other wires now have too much delay. This problem is known in the industry as the "timing convergence" problem. According to some empirical studies, it generally takes 50 iterations in order to complete a design. At several weeks per iteration, the design cycle time is a significant factor in the cost and delay in the design and implementation of a chip. When the wire delays actually become dominant for DSM designs, the timing convergence problem is seriously exacerbated.

Thus, it would be desirable to have an improved design methodology to reduce the design cycle time for the design and implementation of deep sub-micron integrated circuits.

SUMMARY OF THE INVENTION

In general, the present invention is new methodology for the design and implementation of deep sub-micron integrated circuits, in which the delays of the global wires are minimized first, before the logic is synthesized and optimized. This results in a substantial improvement in productivity and convergence of complex deep sub-micron systems on a chip. The present invention reduces design cycle time by eliminating implementation iterations as much as possible while also improving manufacturability.

More specifically, the methodology of the present invention minimizes the delays associated with the global wires first. Starting with an RTL description, a designer focuses on the physical view by defining the approximate areas for each block, and determining what pins are required for each block.

The designer then uses known development tools to do block placement and optimization. The pins are connected with no timing constraints and each wire is qualitatively assigned to a metal layer based on length. Once a wire is assigned to a metal layer, the wire is run as fast as possible. In other words, based on the source and sink, buffers (drivers, repeaters) are placed at some optimal distance.

With each wire optimized, each block now knows exactly how much time is left in a single clock period in order to perform the requisite logic functions. Using a new technique to repartition the blocks into cores and a shells, the present approach eliminates the need to guess the proportion of time to allocate to each block, and calculates the actual time needed. A core is the logic in a block bounded by registers, and a shell corresponds to the logic in the module between core and the pins of the module. In general, logic that is completely bounded by memory elements is a completely local problem (i.e. in the core). Thus, between the memory elements in different blocks, the timing constraint is "T" and must be met. The shell is then synthesized and since the wire is already optimized for time W, the total delay should be $a+b+W<T$.

During shell synthesis, if the wire delay is too great and there is no way that the logic can be synthesized to work, then the wire must be moved to a faster layer. Since every wire is absolutely optimized within its first layer, if it is too slow during synthesis, it must be moved. BuildGates®, a registered trademark representing a commercially available Cadence Design Systems synthesis tool, can be used to perform this synthesis, and once these constraints are met, the design is very near completion since no estimation has been used.

The shells are then recombined with the cores and the cores are synthesized. This performs both logic optimization and synthesis, and place and route inside each block. The design is basically complete, except for other standard optimization and verification procedure that well known in the art. For example, the wires are "over-designed" in the beginning to make them as fast as possible, and later some area may be recovered by dropping some of the repeaters at the end if they are not absolutely necessary. The present technique greatly reduces the number of design iterations required by prior art approaches, and provides an order of magnitude reduction in design cycle time.

The invention may be conveniently implemented in programming on a general purpose computer, or networked computers, and the results may be displayed on an output device connected to any of the general purpose, networked computers, or transmitted to a remote device for output or display. In addition, any components of the present invention represented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), and co-ax cable(s), etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

The present invention will be readily understood by the following detailed description in conjunction with the accompanying drawings, wherein like reference numerals designate like structural elements, and in which.

DESCRIPTION OF THE PREFERRED EMBODIMENTS

Figure 1:
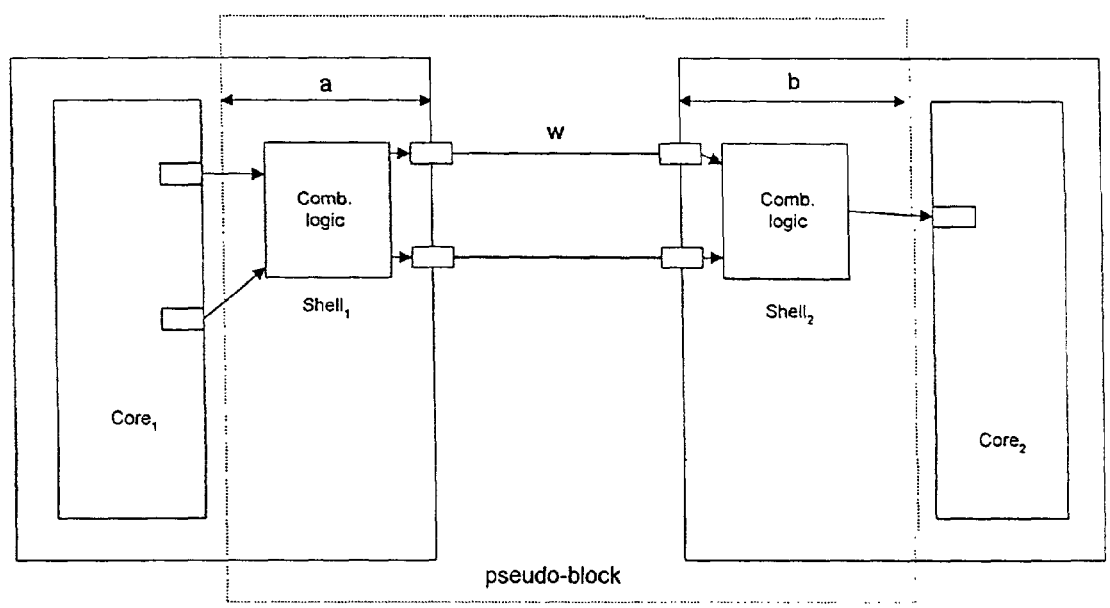
FIG. 1 is a diagram illustrating the shell and wire timing analysis according to the present invention.

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a method for designing and implementing deep sub-micron integrated circuits. Any and all such modifications, equivalents and alternatives are intended to fall within the spirit and scope of the present invention.

In general, the present invention is new methodology for the design and implementation of deep sub-micron integrated circuits, in which the delays of the global wires are minimized first, before the logic is synthesized and optimized. This results in a substantial improvement in productivity and convergence of complex deep sub-micron systems on a chip. The present invention reduces design cycle time by eliminating implementation iterations as much as possible while also improving manufacturability. The present approach uses a design flow which is topology driven, as opposed to the functionally (or HDL) driven ASIC design flows currently in existence.

The present invention assumes that a minimum design cycle is the primary goal, as long as the minimum required performance is achieved. Optimality of the design, in the sense of maximizing absolute performance, minimizing area or power is secondary to design cycle time. Early integrated circuit (IC) and application specific IC (ASIC) designs were strongly driven by the needs of computer designers. Maximizing performance was often the primary goal of these designers (i.e. obtaining the highest possible clock rate). Design flows and design technologies were focused on obtaining the maximum achievable performance for the most aggressive semiconductor process technology available. Consumer electronics is now the primary driver of new designs, and performance at any cost is no longer the critical goal. Instead, time to market becomes the critical parameter. Almost as important is the need for fast ramp up into volume production, creating a new emphasis on predictability and manufacturability.

The ASIC methodology was originally created to address this need. However, as the IC process technology continues to shrink, the combined effects of large dies and the increased share of the interconnect in the timing budget are making quick convergence in the implementation process extremely hard, thus defeating the promise of fast time to market brought by the ASIC concept.

The growth in functional complexity is being addressed by moving design decisions higher (in abstraction). Instead of building from basic functional elements, such as gates, adders, multiplexors, etc., entire subsystems are being reused, such as processors, memories and other function specific cores (so-called "reusable cores"). ASICs are thus becoming Systems-on-a-Chip (SOCs). While this approach has shown fundamental improvements in design cycle time, it does not reduce the physical complexity of designs, at the transistor-interconnect level.

The present invention addresses the problem of reducing design cycle time for ASICs with 0.18 micron or smaller process geometry, by eliminating implementation iterations as much as possible. For such small processes, global effects such as block placement and global routing have a strong effect on design feasibility. These effects become significantly pronounced as process size decreases, resulting in an increased need to iterate in the design cycle.

The basic principle underlying the proposed flow is to provide simpler and more relevant information to a designer by automatically processing and maintaining as much known information of the design as early as possible in the design cycle. The net effect of this approach is to create a set of "projected" constraints derived from the given data that the unexplored portions of the design must meet. This allows the designer to focus effort on the unexplored parts of the design, or indicates a problem with the design partitioning early in the design cycle, before significant, wasted effort has been invested.

The present methodology goes against conventional thinking in that it does not rely on estimation tools to predict constraints in order to drive synthesis and placement tools. Instead, the present invention relies on global aspects of chip implementation to be done prior to logic synthesis or timing optimization.

The present technique reduces the number of iterations and improves convergence by fixing globally affected variables up-front. The core logic that resides between registers is relatively easy to synthesize in isolation, since the external effects are buffered by memory elements. However, communication logic, that transport signals between various hierarchical blocks and core logic, is difficult to synthesize and optimize in isolation, because of its dependence on the drives and loads of gates that belong to different blocks, as well the inclusion of global interconnects in it. Since synthesis and timing optimization has limited means of predicting the delays of global interconnects, it often results in gross over or under estimation of this delay, and re-synthesis of communication logic after global routing. The present invention fixes global interconnect delays by introducing an optimal buffering stage before communication synthesis, a step that provides a linear, predictable delay model that is only mildly dependent on drive and load logic, thus isolating communication synthesis from the yo—yo effect that otherwise could occur.

As discussed herein, it is assumed that a design is made of functional sub-units that have a physical representation: the "blocks". Blocks may or may not have storage elements at their boundary, and there are no assumption on the size of a block. The primary problem associated with performing system chip synthesis using currently available commercial tools may be viewed as the interaction of global physical design effects such as placement and routing with logic synthesis of each of the design blocks. Design blocks (specifically soft blocks) are implemented using a logic synthesis tool that must consider area and delay constraints due to both local and non-local (or global) wires. This is a difficult problem that stresses the limit of synthesis tools in two directions: (i) the capacity to represent an entire design as synthesis data structures (ii) techniques that perform logic optimization while accounting for local and non-local physical design effects are largely undeveloped.

According to the present technique, the delay and area effects of global wires are separated from the local effects of the design blocks. A fundamental premise of the present approach is the ability to project the global area and delay constraints from the global view of the design to small sets (usually of cardinality two) of design blocks. Projection of constraints is different from estimation and is a key innovation of the present approach.

In fact, delay estimates are not used in the entire process. Thus, the operation of delay budgeting, which appears central to all other planning tools, is not utilized in the present process. By factoring out the delay attributed to global wires, the synthesis tools (such as BuildGates® or DesignCompiler) are instructed to perform logic optimization without concern for wire delays on the long interconnect.

Early area estimates needed to perform block placement at the chip-level are treated as constraints that have to be met by the implementation. Any corrections to the area estimates are processed incrementally from the design level at which they were originally created.

More specifically, the methodology of the present invention minimizes the delays associated with the global wires first. Starting with an RTL description, a designer focuses on the physical view by defining the approximate areas for each block, and determining what pins are required for each block. This approach uses existing development tools to determine actual parameters, whereas the prior art approach predicts what subsequent tools will do, and uses the prediction to estimate a current result. The present approach avoids the guesswork associated with prediction based tools. In fact, the only estimation necessary in the present methodology is to estimate the size of each block. If this estimate turns out to be significantly off, the process is iterative so that once a more accurate measure of block sizes is available, the design can be adjusted.

The designer then uses known development tools to do block placement and optimization. The pins are connected with no timing constraints and each wire is qualitatively assigned to a metal layer (fast, medium, slow) based on length. Once a wire is assigned to a metal layer, the wire is run as fast as possible. In other words, based on the source and sink, buffers (drivers, repeaters) are placed at some optimal distance. This process is described in further detail below, and a closed form solution is available for determining how to optimally place the buffers. Thus, each wire is run as fast as possible in whichever layer it is assigned. As a result, a designer no longer needs to iterate to determine the timing constraints for each wire, since each wire cannot run any faster. This avoids a key problem with the prior art approach.

With each wire optimized, each block now knows exactly how much time is left in a single clock period in order to perform the requisite logic functions. Consider that if a wire has delay W, a clock period is T, and the delay on each side of the wire a and b, then a+b<=T-W. The prior art approach is to guess the proportion of time to assign to "a" and to "b".

Using a new technique to repartition the blocks into cores and a shells, the present approach eliminates the need to guess the proportion of time to allocate to each block, and calculates the actual time needed. A core is the logic in a block bounded by registers, and a shell corresponds to the logic in the module between core and the pins of the module. In general, logic that is completely bounded by memory elements is a completely local problem (i.e. in the core). Thus, between the memory elements in different blocks, the timing constraint is "T" and must be met. Rather than partition the block as originally conceived, the block is repartitioned to consider the shell as a block, or pseudo-block.

Referring now to the drawings, wherein like reference numerals designate identical or corresponding parts, and more particularly to FIG. 1 thereof, there is illustrated a block that has been repartitioned to consider the shell as a block, or pseudo-block. The shell is then synthesized and since the wire is already optimized for time W, the total delay should be a+b+W<T. During shell synthesis, if the wire delay is too great and there is no way that the logic can be synthesized to work, then the wire must be moved to a faster layer. Since every wire is absolutely optimized within its first layer, if it is too slow during synthesis, it must be moved. BuildGates® can be used to perform this synthesis, and once these constraints are met, the design is very near completion since no estimation has been used.

The shells are then recombined with the cores and the cores are synthesized using PKS from Ambit group (Physically Knowledgeable Synthesis), or Cadence®. This performs both logic optimization and synthesis, and place and route inside each block. The design is basically complete, except for other standard optimization and verification procedure that well known in the art. For example, the wires are "over-designed" in the beginning to make them as fast as possible, and later some area may be recovered by dropping some of the repeaters at the end if they are not absolutely necessary. The present technique greatly reduces the number of design iterations required by prior art approaches, and provides an order of magnitude reduction in design cycle time.

As described, this design process incorporates at least three unique steps:
1. The physical optimizations (routing, buffering, pin assignment) are performed before the synthesis and logic optimization.
2. Ensuring optimal wiring provides a closed form solution for wire timing, and the closed form solution specifies the delay just by routing wire (optimal wiring yields linear delay model for chip-level routing)[.
3. The partitioning of blocks into shells and cores requires no explicit timing estimation and/or budgeting.

The following is a more detailed discussion of the flow required to realize the process of the present invention.

Terminology

A design boundary is a rectangle.

An I/O pin is a point inside a design boundary.

A block is a rectangle (a set representing permissible lengths and widths).

A block pin is a point in a block.

A pin is either an I/O pin or a block pin.

A connection is a set of pins (I/O or block) with at least two elements (representing desired electrical connections).

A layer is an element of the set of layers $\{1, \ldots, L_{max}\}$.

A wire plan is a function that maps a connection to a layer (or a collection of layers).

A placement is a function that maps a block to a point and a rotation (representing position inside a design boundary).

A pin assignment is a function that maps a block pin to a layer and point inside the block's rectangle.

A wire segment is a pair of points and a layer, and possibly a width (representing a line/rectangle of given width between two points).

A wire is a set of wire segments whose projection onto $R^2$ is connected.

A routing is a function that maps a connection, and an associated pin assignment, to a wire.

A shell is a RTL representation of the logic between a block's pin and a set of internal nets. This set of internal nets partitions the block logic into the shell logic and some internal logic. Any path between the internal logic and block pins must pass through exactly one of these internal nets. This set of internal nets is called a shell boundary. The internal logic contained within the shell boundary is referred to as the core.

According to the present invention, after the global wire delays have been optimized, the blocks are partitioned into cores and shells. The modularity of a design description reflects the functional intent of the design, but is not particularly suitable for design analysis and delay budgeting. Module boundaries do not always correspond to register elements (flip flops) and cycle boundaries. As a result, it is extremely difficult to assign delay budgets to the logic circuits in a chain comprising two modules connected by wires. Current state of the art approaches rely on estimating what the logic circuits will be, once implemented, before actually creating (synthesizing) these circuits. This approach of "second guessing synthesis" is extremely complex and potentially error-prone.

According to the present invention, a new abstraction for logic modules (blocks) are defined: a core, which is bounded by registers, and a shell which corresponds to the logic in the module between core and the pins of the module. This assumes that the modules have been physically placed (a floorplan) so that the delay of the interconnect between modules has been extracted. By synthesizing communicating shells together, the present technique eliminates entirely the process of delay budgeting, while arriving at the optimal implementation of the design. Table 1 is a Verilog fragment illustrating a simple method of representing a shell and its core.

TABLE 1

```
module block_shell(...);
    //Combinational RTL around core...
    //The arguments to inst define the shell boundary...
    block_core inst(...);
endmodule
module block_core(...);
    //
endmodule
```

Figure 2:
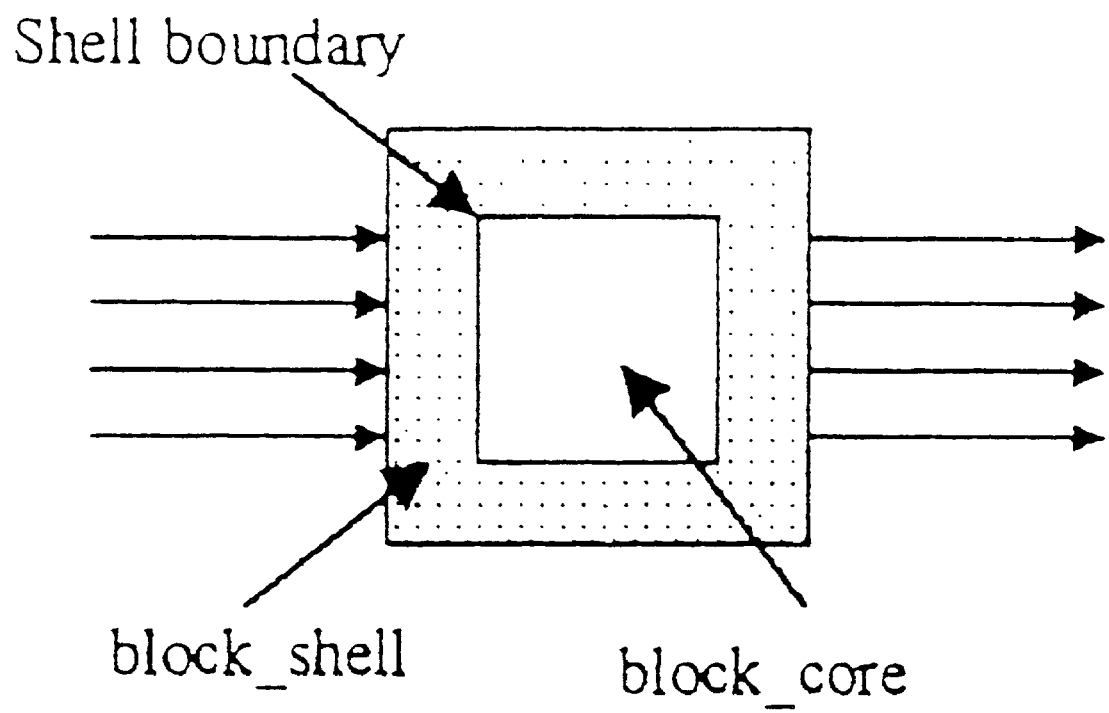
FIG. 2 is a diagram illustrating a shell and a core of a block.

FIG. 2 illustrates a block partitioned into a shell and a core. Each design block is partitioned into a shell and a core such that all nets in the shell boundary are either latch outputs or latch inputs. This requirement removes the need to perform time budgeting. This partitioning is directly available if the shell is separated from the core, otherwise the partitioning of an RTL (or lower design) block into shell and core may be performed automatically. Also, it is assumed that the shell contains only combinational logic. Combining this assumption with the previous requirements implies that all signals are latched on the core side of a shell boundary. The present invention also assumes that the appropriate technology information and libraries are available in order to estimate the wire delays, to extract wiring parasitics, and to perform synthesis of the shells. Also, it is assumed that all global wires are optimally buffered (i.e. operated at maximum speed) This requirement is ensured by construction.

Flow Outline

The following is a rough outline of the proposed flow:

Determine a block placement

Determine a wire plan and pin assignment

Determine routing and global wire delays

Perform optimal buffer insertion

Validate wire delays

Synthesize shells and perform a timing analysis

The first three steps determine the global wire delays (assuming a linear delay model), taking into account the placement, the layer availability and the routing. The last step synthesizes the shells, taking the global wire delays into account, and verifies that each global path (including the shell portion of the logic) meets its cycle time constraint. After the last step, the designer needs to write an RTL to implement the block internals.

Figure 3:
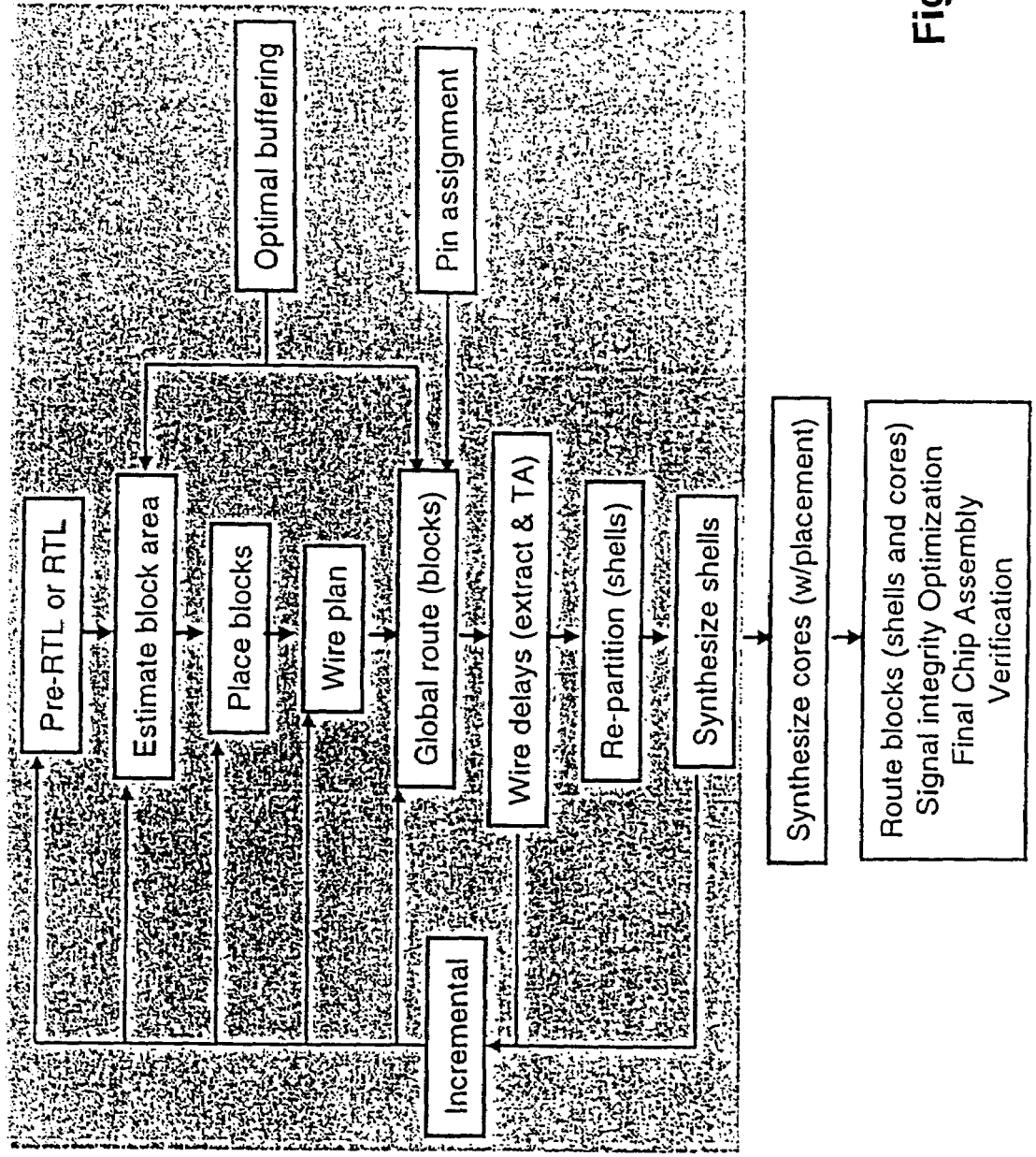
FIG. 3 is a flow diagram of one embodiment of the present invention.

FIG. 3 illustrates the flow in more detail. The shaded area represents the flow described herein. The steps are described in further detail below:

Determining a Block Placement

Input

The blocks at the top level of the design, the I/O pins and the connections must be specified. Each block is specified as an area and an interval of permissible aspect ratios. Both I/O pins and blocks may be pre-placed.

Output

The output of this step is a block placement along with an I/O cell placement.

Implementation

The top level of the design is given as a Verilog module. The top-level module contains instances representing blocks, and nothing else. The design is imported into areaPdp using ver2hld, keeping all blocks as macros. The purpose of this step is to define the blocks and their connectivity. Estimated areas for each block are specified using the area Pdp DEFCELLTOABSTRACT declaration.

TABLE 2

```
module top(...);
    // Contains nothing but instances...
    block_shell_1 inst1 (...);
    block_shell_2 inst2 (...);
    // etc., etc.
endmodule
```

The following is a preferred method of specifying the area of a block:

First the designer selects the expected collection of cells from the library that will be used in the design (the library may also be referred to as a catalog having cells or IP blocks and/or other referenceable design items). Then the designer specifies the number of expected instances and utilization of each cell. The utilization of a cell is a measure of the expected waste area of a cell when finally placed. The block area is computed by multiplying these quantities for each cell and summing the result.

Next, a design boundary is created. (The placer requires this.) In area Pdp, this requires specifying (among other things) a "logic cell routing ratio" and an "I/O Circuit to Core Distance." The routing ratio is an estimate of the wastage due to routing. The I/O cells are specified in a file, which specifies where the I/O cells will appear on the design boundary (top, bottom, right, left). A placer may be used to determine an initial block placement. This placer determines an initial block packing using sequence pairs, then improves the packing by taking connectivity into account. Legal moves of the placer include rotations, swapping and changing block aspect ratios (if permitted for the block in question).

The placer can execute in an incremental "improve" mode, which makes only local changes to the packing. This incremental mode of operation is important because it permits the placer to behave in a robust manner when small changes are made to the block sizes. As used herein "robust" means that small changes to the inputs (block areas) do not drastically affect the output (the placement). This reduces the amount of design rework required when small changes are made. A simulated-annealing based algorithm is an example of a placer that is not robust in this sense.

A Pillar .dpux file is generated that describes the blocks, I/O, design boundary and connectivity. This file needs some further annotation to pass the collection of allowable block aspect ratio ranges to the placer (the areaPdp interface only permits a single global aspect ratio range to be specified). The placer also generates another .dpux file containing the placed blocks.

Determining a Wire Plan and Pin Assignment

Inputs

The placement information and inputs from the previous step must be specified. Some technology related data is required to determine the critical lengths and delays for each layer. To determine a pin assignment, a rectangle must be specified for each block pin, indicating the range of legal placements (the pins are not restricted to lie on a block boundary).

Outputs

The output is a wire plan and a pin assignment (as defined in the Terminology section).

Implementation

Optimal Wire Plan

The wires are sorted by length (maximum $l_1$ distance between the centers of any two blocks on the wire), and a maximum available length per layer is determined. Layers are assigned to wires using the following rule: The longest unassigned wire is assigned to the highest available layer until the maximum available length is reached for that layer. This solution requires that the wire lengths be extracted from the .dpux file.

Optimal Pin Assignment

A pin assignment (for routing) is determined using areaPdp pin optimization. This requires specifying a layer (possibly two) for each pin. AreaPdp places the pins on the block boundary. Busses can be handled as a single object and the output is a pin assignment Alternately, this problem can be expressed and solved as a linear program. The output of the linear program may need to be finessed, however, to avoid pin overcrowding.

Determining a Routing and Global Wire Delays

Inputs

The inputs and outputs from the previous step must be specified. Some additional technology related data is required to specify wire widths, via specification, design rules, etc., to the router. Clock signals must not be routed at this stage. It is possible that some manual routing will be required. Also, any blockages ("keep-outs") over hard Intellectual Property (IP) blocks must be specified.

Outputs

The outputs of this step are a DEF file describing the global route, and a file associating a delay with each global wire.

Implementation

IC Craftsman®, a registered trademark of Cadence Design Systems that represents a commercially available IC layout system, may be used to determine a global routing. IC Craftsman® uses a linear delay model that is consistent with optimal buffering. Different delays can be specified on each layer (by using time_length_factors or layer_length_factors properties). It is also possible to specify that a net should be routed on a specific layer (by using the use_layer property). Area Pdp can export the design to IC Craftsman® by creating a .dsn file. Before passing this to IC Craftsman®, the output needs to be modified to add the layer delay properties and the information from the wire plan. IC Craftsman® can then generate a global route.

The IC Craftsman® output is used to determine the global wire delays. The wire lengths must be extracted from the DEF file. The delay is computed by multiplying the wire length by the delay constant for that layer.

Perform Optimal Buffer Insertion

Inputs

The global route from the previous step. Some technology related data is required to construct the optimal buffers.

Outputs

As output, a description of the buffers inserted, including position and associated wire and a modified global route is produced.

Validate Wire Delays

Inputs

The modified global route from the previous step, the optimal buffer sizes, and the block pin loads and drivers. Also, some technology related data.

Outputs

A table indicating the predicted global wire delays versus the actual delays based on extraction.

Implementation

Hyperextract, a tradename for a parasitic extraction tool that has been validated on 0.18-micron chip manufacturing processes and is commercially available from Cadence Design Systems, can be used to extract the parasitics for each wire segment, which generates a SPF file. BuildGates® and/or Pearl can then determine the timing based on this SPF file and a description of the buffers.

Synthesizing Shells and Performing a Timing Analysis

Figure 4:
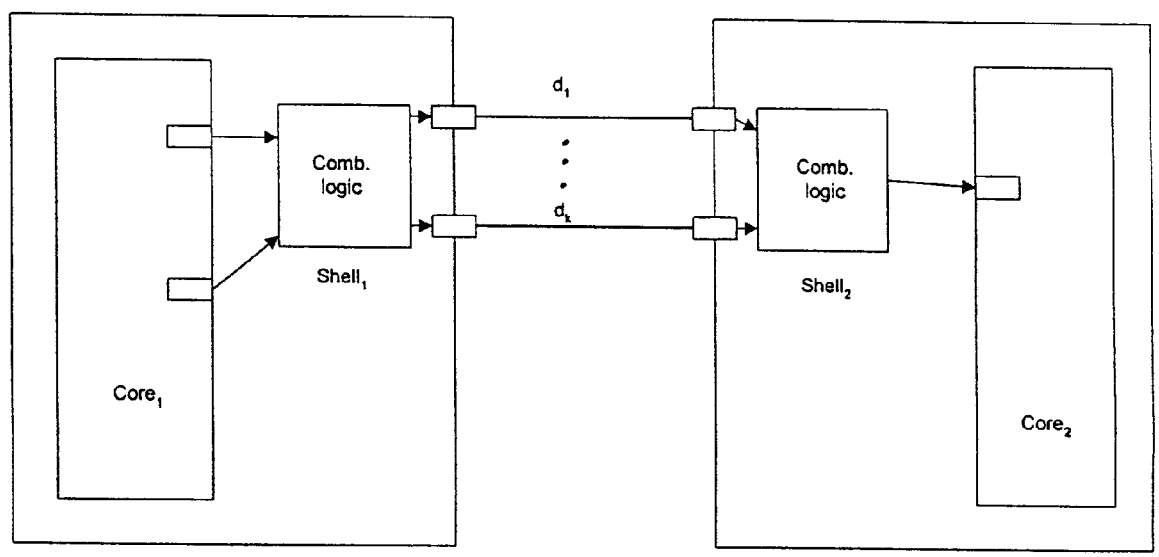
FIG. 4 is a diagram illustrating shell synthesis taking the wire delay into account.

The remaining step is to synthesize the shells taking global wire delay into account, and to verify that each path meets its cycle time constraint. The present technique requires that all shells be synthesized simultaneously taking the global wire delays into account. To elaborate this requirement, consider a simple example, illustrated in FIG. 4.

The requirement is to synthesize the portions of $Shell_1$ and $Shell_2$ driving a latch in $Core_2$, taking the wire delays ($d_i$) into account. In this example, the latch in $Core_2$ is a combinational function of latch outputs in $Core_1$.

The traditional approach is to choose an arbitrary time budget for each shell which results in a set of required time constraints for the outputs from $Shell_1$ and a set of arrival time constraints for the inputs to $Shell_2$. Each shell is then synthesized independently. This approach has two limitations: (i) A time budget must be selected a priori. (ii) It is not possible to perform optimizations across the two shells.

Inputs

The inputs for this step are the shell for each block, a target library, the global wire delays, the arrival times for shell inputs driven by core latches. Also, the required times for shell outputs that drive core latches, the relevant clock periods, etc., the load that each global wire presents, and the drivers for each global wire.

Outputs

A gate level netlist is produced for each shell that meets the specified timing constraints. Also, an estimate of the area of each shell is output.

Implementation

This step needs to simultaneously synthesize all shells taking the wire delays into account, subject to the constraint that block boundaries are preserved. One possible solution is to use BuildGates® to perform the synthesis. The appropriate library must be selected and the clocks and constraints must be defined. The global wire delays may be modeled using SDF. Apparently, BuildGates® requires the SDF be specified in terms of pins on mapped library instances (as opposed to module I/O pins). This may require either an initial quick synthesis, or insertion of appropriate driver and receiver cells at each end of the global wires.

Figure 5:
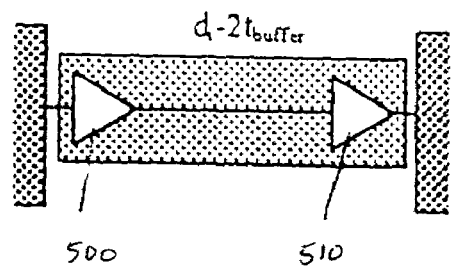
FIG. 5 is a diagram of one possible global wire delay model.

The global wires then need to be modeled appropriately. One possibility is to replace each global wire by two appropriate buffers (e.g., buffer 500 and 510 as shown in FIG. 5) from the technology library (or other catalog), and use SDF to define the delay between these two buffers. The buffer insertion delays must be taken into account.

BuildGates® can also be used to verify that the timing constraints are met. Finally, need to report the area remaining in each block (i.e. verify that the block area is less than the shell area).

Shell and Core Partitioning

Figure 6:
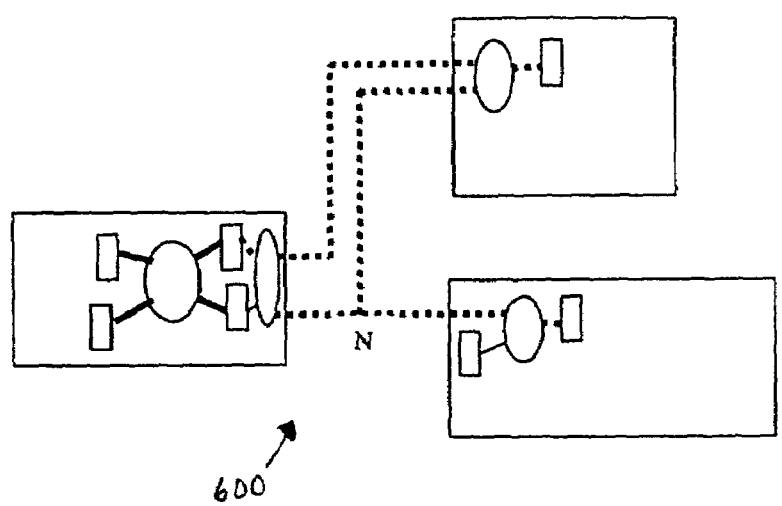
FIG. 6 is a diagram illustrating global and local timing constraints on a chip.

Shell and core partitioning is an important aspect of the present invention, and will now be discussed in further detail. A global timing constraint occurs when logic gates (or latches), spanning two or more physical blocks, are connected to each other by a wire. An example is the net-list N 600 shown in FIG. 6. Local timing constraints arise during the synthesis of a set of gates (or latches) within a single physical block (the unit of a synthesis run). For this discussion, it is assumed that PKS will be used to optimize local timing constraints, during the synthesis of each physical block.

A key differentiation of the present methodology as compared to existing techniques is the ability to generate and process global timing constraints. There are two parts to the present solution. The first part follows from the realization that the logic elements within each physical block can be partitioned into two sets: those that participate in global timing constraints and those that do not. This yields a partition of each physical block into a core (elements limited to interacting with local timing constraints) and shell (elements related to global timing constraints).

Figure 7:
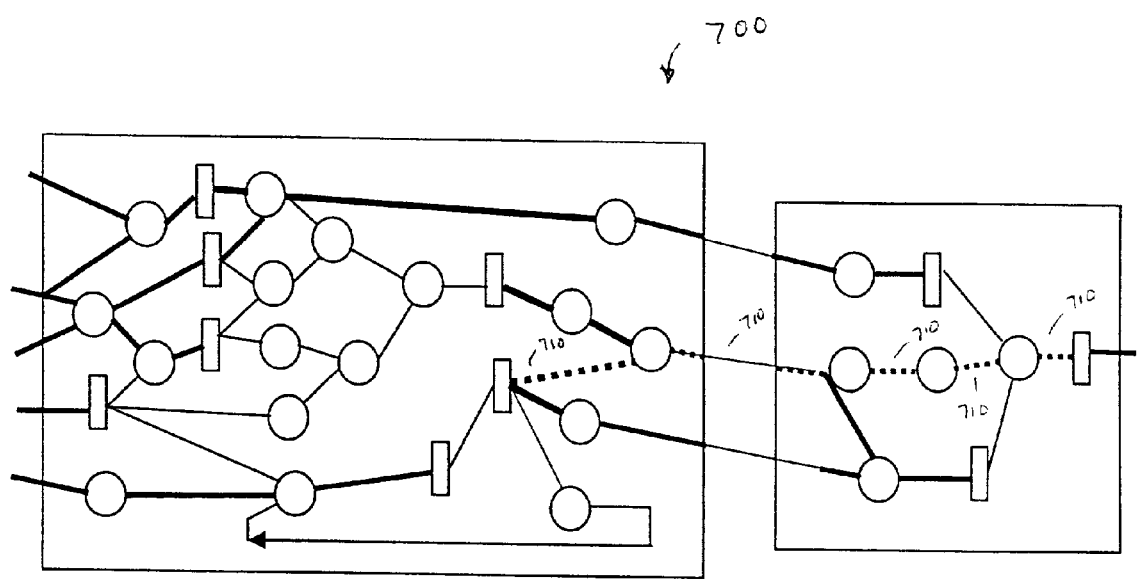
FIG. 7 is a diagram illustrating shell paths and core paths.

Consider the graph 700 representation of a chip shown in FIG. 7. All paths in the figure have signal direction from left to right, except where indicated by an arrow. The paths in bold are shell paths. The decomposition of the chip into global and local timing constraints is achieved using the notions of Core Paths and Shell Paths. For the purposes of this discussion, a tri-state gate is treated similar to a combinational logic gate. The term memory element refers to a flip-flop, level-sensitive latch or RAM/ROM element. The input of a memory element includes both the clock and data inputs.

A path is an alternating sequence of connections and combinational logic gates $\{c_0, f_0, c_1f_1, \ldots, c_mf_m, c_{m+1}\}$ where connection $c_i$, $0<i\leq m$, connects the output of gate $f_{i-1}$ to an input of gate $f_i$. When a single connection exists between $f_{i-1}$ and $f_i$, the connection may not be enumerated. The length of a path is the sum of the delays on the gates and connections on the path. The rising and falling delay may be different for each gate and connection. The inputs of $f_i$, other than $f_{i-1}$ for a path $P=\{f_0, f_{i-1}, \ldots, f_n\}$ are called the side-inputs of $f_i$.

Definition: A path P is a Shell Path if:
1. P is from an input pin of block B to an input of a memory element of B or an output pin of B; or
2. P is from the output of a memory element to an output pin of B.

Definition: A path P from the output of a memory element to an input of a memory element is called a Core Path.

By definition, every path from an input pin or output of a memory element output to an output pin or input of a memory element must either be a Shell Path or a Core Path.

Under the most naive clock design, the timing constraint for a Core Path is that its delay is less than the clock period. These timing constraints can easily be extended to account for multiple clocks, false paths, multiple cycle paths, clock skews, and cycle stealing constraints that arise in more realistic clock designs.

Note that the timing constraint for a Shell Path is not explicitly specified. Consider the net-list shown by the dotted line 710 in FIG. 7. The timing constraint for the two Shell Paths plus the global interconnect (all indicated by the broken line in the figure) is that the total delay is less than the clock period. Since the delay of the global interconnect will be extracted (or computed) using the actual chip-level route (including optimal buffering), the timing constraint is that the delay of the two Shell Paths is less than the clock period minus the global interconnect delay between the two Shell Paths.

Although the notion of Shell Paths and Core Paths provide a clear demarcation of global and local timing constraints, the timing constraints for Shell Paths and Core Paths have to transformed into constraints that may be efficiently utilized by the current versions of BuildGates® and PKS.

The existing usage model for BuildGates® and PKS operate on blocks of logic where timing constraints are specified on the input and output terminals of the block (in addition to clocking constraints). This model requires that a block B gets partitioned into two components. termed the Shell and Core. Global timing constraints apply to the Shell while local timing constraints apply to the Core.

Definition: The transitive fan-out of a gate P is the set of all gates included on any combinational logic path from P up to a memory element or an output pin.

Definition: The transitive fan-in of a gate P is the set of all gates included on any combinational logic path from a memory element, or an input pin, up to P.

The transitive fan-in (fan-out) of a set of gates is the union of the transitive fan-in (fan-out) of each gate in the set.

Definition: Given a block B, the Shell Logic includes any gate in the transitive fan-in of the transitive fan-out of an input pin, or any gate in the transitive fan-in of an output pin.

Definition: Given a block B, the Core Logic includes any gate not in the Shell Logic.

Figure 8:
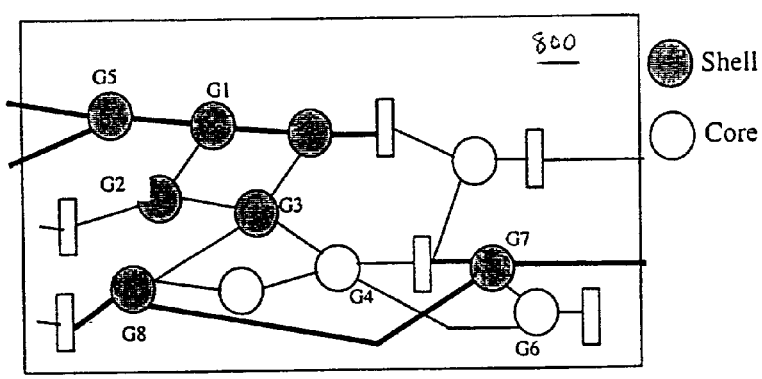
FIG. 8 is a diagram illustrating shell and core logic.

The Shell Logic may be extended to include each memory element M for which either (i) the output of M is connected to a gate in the Shell Logic, or (ii) the input of M is connected to a gate in the Shell Logic. An example of the Shell and Core logic 800 for a block is shown in FIG. 8.

The synthesis procedure may be described as follows:

Synthesize all shells at the chip-level. Timing constraints are implicitly specified on Shell Paths—the delay of the logic gates plus the inter-block interconnect (presumably with optimal sized buffers already inserted) must he less than the clock period.

Any timing constraints that are violated for one or more Shells require a change at the chip-level (for example, performing one or more of the incremental operations of block placement, pin assignment, wire-planning, global routing, buffer insertion).

Assuming all timing constraints are met for Shells, the timing constraints from the Shell are projected onto the Core Logic. These timing constraints are projected as arrival time constraints on the inputs of gates in the Core Logic that are connected to gates in the Shell Logic; for example, gates G4 and G6 in FIG. 8. Positive slack on the Shell Logic may be distributed utilizing standard slack distribution algorithms. If PKS is used, both the Core and Shell are synthesized with the timing constraints to ensure a complete and legal physical implementation (i.e. detailed placement) for the block. In this case, additional timing constraints are derived for the pins of the block. If BuildGates® is used, only the timing constraints on the Core Logic are targeted.

Figure 9:
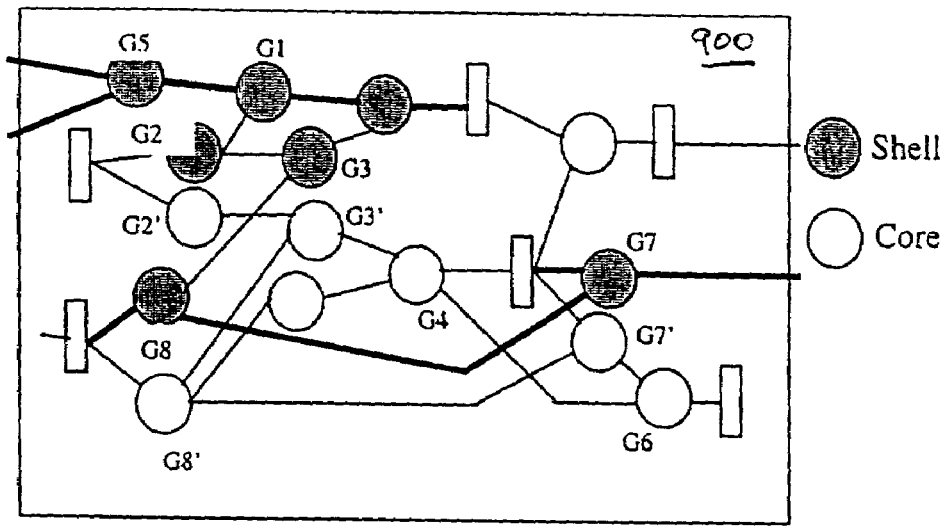
FIG. 9 is a diagram illustrating the duplication of gates to satisfy the timing constraints for the core logic.

Failed timing constraints for the Core Logic fall into two categories. In the first category, a path that starts and ends at a memory element within the Core Logic violates the timing constraint. In this case, the Core Logic must be re-designed. In the second category, the arrival time projected onto the Core Logic by the Shell Logic may cause a timing constraint to be violated. An example is the arrival time of the outputs of G3 and G7 at the gates G4 and G6. Respectively, in FIG. 8. In this case, duplication of the core of logic for the gates G3 and G7 may allow the timing constraints to be satisfied. The resulting logic 900 is shown in FIG. 9. If this logic fails to meet timing constraints, the Core Logic must be re-designed.

Under these definitions, Cores may be treated as independent units of logic that are isolated from the rest of the chip. However, given the nature of the definition, the size of the Shell may be quite large relative to the size of the block. The necessary and sufficient condition under which the entire block composes the Shell is when the Core is empty. The Core as defined above does not necessarily have to be bounded by memory elements—(as shown in FIG. 8).

It should he noted that an alternative definition of a Cycle-Bounded Core, which is bounded by memory elements, exists. Given a block B, the Cycle-Bounded Core Logic includes any gate which is not in the transitive fan-out of the transitive fan-in of the transitive fan-out of an input pin, and not in the transitive fan-out of the transitive fan-in of an output pin. This may reduce the number of gates included substantially from the definition of Core Logic shown above. The gate G4 in FIG. 8 is only involved with timing constraints for paths within the block; hence it is included in the Core Logic even though it is not in the Cycle-Bounded Core Logic.

Result: The Core Logic for a block B is empty if for each memory element L in B, there is at least one path from an input pin up to L, or there is at least one path from L up to an output pin.

Although the gates G2 and G3 in FIG. 8 are included only in Core Paths, there are two ways that they have an impact on the delay of Shell Paths, hence they are included in the Shell Logic. First, the output slew of G2 and G3 will affect the delay of gates on the Shell Path such as G1. Second, the delay of a gate on the Shell Path may he a function of the correlation of the signal values on all its inputs. For example, G1 may have a different delays for the rising signal based on whether there is a rising signal or falling signal on the input G2.

Both of these effects on the delay of a Shell Path gate may be treated as second-order effects, especially in the early iterations of Shell and Core synthesis. If these effects are ignored, the number of gates that need to be simultaneously synthesized by considering all the Shells at the chip-level may be dramatically reduced.

The following provides a definition for a potentially smaller version of the Shell, which excludes any gate that is in the Shell Logic that is not on a Shell Path. This reduced Shell will be named a Sub-Shell and is defined as follows:

Definition: Given a block B, the Sub-Shell Logic includes any gate G which is on a Shell Path for the block B.

Definition: Given a block B, the Expanded Core Logic includes any gate not in the Sub-Shell Logic.

Figure 10:
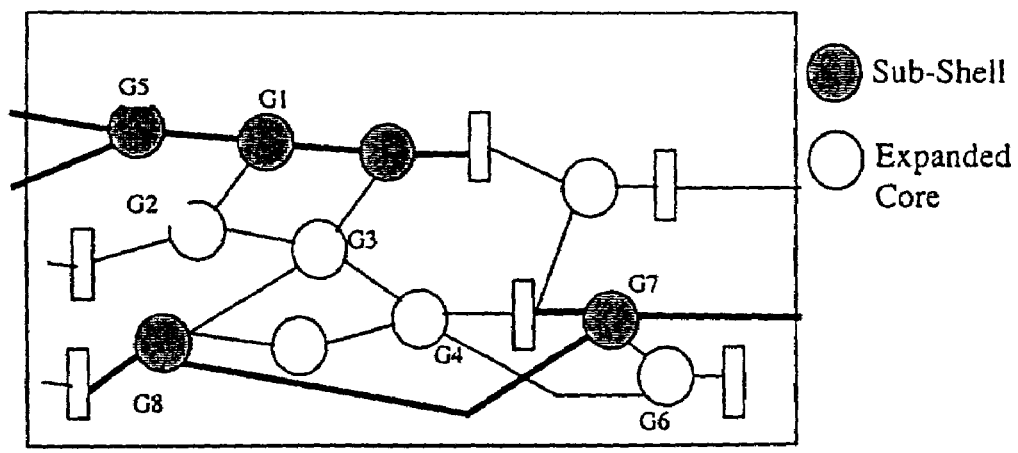
FIG. 10 is a diagram illustrating the sub-shell and expanded core logic.

FIG. 10 illustrates the impact of using the Sub-Shell and Expanded Core Logic definitions on the timing analysis and synthesis steps of the present invention. Note that gates in the Sub-Shell may now generate required time constraints on the Expanded Core Logic gates. For example, in FIG. 10, synthesis of the Sub-Shell will generate required time constraints on the output of the gates G2 and G3. Arrival time constraints may also be generated. as on gate G6 from the gate G7. The synthesis procedure for processing Sub-Shells and Expanded Cores is as follows:

1. Synthesize all sub-shells at the chip-level. Timing constraints are implicitly specified on Shell Paths—the delay of the logic gates plus the inter-block interconnect (presumably with optimal sized buffers already inserted) must be less than the clock period. Assume all Expanded Core gate arrival times are set to negative infinity.

2. Any timing Constraints that are violated for one or more Sub-Shells require a change at the chip-level (for example, performing one or more of the incremental operations of block placement, pin assignment, wire-planning, global routing, buffer insertion).

3. Assuming all timing constraints are met for Sub-Shells, the timing constraints from the Sub-Shell are projected onto the Expanded Core Logic. These timing constraints are projected as arrival time or required time constraints on the inputs of gates in the Expanded Core Logic that are connected to gates in the Sub-Shell Logic. For example, gates G2, G3 get required time constraints, and gate G6 gets an arrival time constraint in FIG. 10. Positive slack on the Shell Logic may be distributed utilizing standard slack distribution algorithms. If PKS is used, both the Expanded Core and Sub-Shell are synthesized with the timing constraints to ensure a complete and legal physical implementation (i.e. detailed placement) for the block. In this case, additional timing constraints are derived for the pins of the block. If BuildGates® is used, only the timing constraints on the Expanded Core Logic are targeted.

4. Failed timing constraints for the Expanded Core Logic fall into three categories. In the first category, a path that starts and ends at a memory element within the Expanded Core Logic causes violation of the timing constraint. In this case, the Expanded Core Logic must be re-designed. In the second category, the arrival time projected onto the Expanded Core Logic by the Sub-Shell Logic may cause a timing constraint to be violated. An example is the arrival time of the outputs of G3 and G7 at the gates G4 and G6, respectively in FIG. 8. In this case, duplication of the cone of logic for the gates G3 and G7 may allow the timing constraints to be satisfied. If this logic fails to meet timing constraints, the Expanded Core Logic must be re-designed. In the third category, the required time projected onto the Expanded Core Logic by the Sub-Shell Logic may cause a timing constraint to be violated. In this case, resort to synthesis of the Shell rather than the Sub-Shell. This will require a re-run of the top-level Sub-Shell synthesis.

Note that the above described heuristic is proposed to avoid processing of large Shells. It may be inevitable to have to process large Shells if the Sub-Shell synthesis process yields too severe required time constraints on the Expanded Core Logic (in Step 4 above).

An issue that has not been addressed is the handling of timing constraints in the presence of level-sensitive latches, where cycle stealing or borrowing across transparent latches is often utilized to meet system-level timing constraints. The process that exists today in BuildGates® and PKS is as follows. Timing optimization of the combinational logic between latches is performed using slack information obtained by using a cycle-stealing based timing analysis. The timing analysis starts with the delays of the current netlist and the required times due to output pins of the design and the clock inputs of the latches. A fixed-point iteration is used to distribute the slack across transparent latches. On each iteration, a single latch is updated as follows: the slack on the latch is set to the mean of the slack on the left and right side logic, and the updated slack is then propagated through the combinational logic on either side of the latch.

Figure 11:
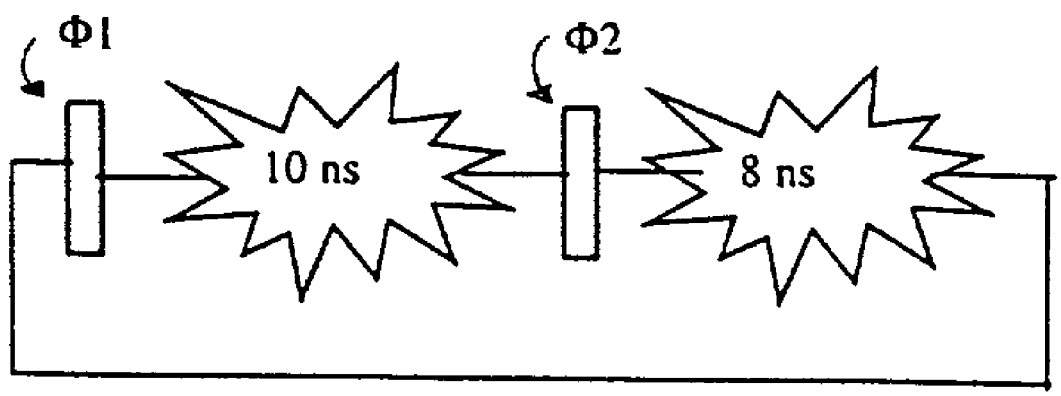
FIG. 11 is a diagram illustrating cycle stealing across latches for slack distribution.

An example is shown in FIG. 11. Assume that $\Phi 1$ and $\Phi 2$ are two phases of a non-overlapping clock (assume clock skew and the setup and hold times are zero for simplicity). Let $\Phi 1$ and $\Phi 2$ each have active duration of 9 ns, with a cycle time of 18 ns. If cycle stealing were not used, the left combinational logic block would have a slack of −1 ns. However, by distributing the slack equally across the $\Phi 2$ latch with cycle stealing, the overall slack is computed to be 0, and the given configuration meets the cycle time. If $\Phi 1$ and $\Phi 2$ had duration 7 ns each with a cycle time of 14 ns, then the slack distribution method would yield a slack of −2 for each logic block. In the absence of cycle stealing the slacks would be −3 and −1 respectively.

In the present methodology, the same slack distribution algorithm may be applied. The implication of adopting this slack distribution algorithm is two-fold: (i) the timing engine in the present invention must access the entire design to perform cycle-stealing operations across the Core and Shell logic. Note that access to the Core and Shell is also required for processing complex timing constraints like false path directives, multi-cycle paths etc., (ii) slack distribution may only be applied once the timing information is available (via synthesis) of the relevant Core and Shell Logic. Slack may also be distributed locally across a latch (near the Core-Shell boundary, for example). More specifically, positive slack on a Shell or Core may be distributed across latches as soon as it is available, negative slack is only distributed when the timing information of the logic on both sides of a latch has been determined.

As described above, the wires at each layer are originally set to run as fast as possible. This is accomplished by inserting buffers, as needed, to maximize the speed for each wire. This produces a linear delay model for point-to-point wiring and eliminates the guesswork and iterations associated with prior art solutions. Any "over-design" of the wires may be recovered at the end of the design process. A preferred method of optimizing the global wires is disclosed in co-pending U.S. patent application Ser. No. 09/919,740, entitled "INSERTION OF REPEATER WITHOUT TIMING CONSTRAINT" filed Aug. 1, 2001, the disclosure of which is herein incorporated by reference. In summary, the present invention utilizes optimal buffer insertion at the chip-level. The produces a constant-running-time, pre-computed delay model. After a block is synthesized, use timing driven buffer resizing (between upper and lower bound). Then to finalize the design, any "over-design" is eliminated to recover chip area.

Those skilled in the art will appreciate that various adaptations and modifications of the just-described embodiments can be configured without departing from the scope and spirit of the invention. Therefore, it is to be understood that, within the scope of the appended claims, the invention may be practiced other than as specifically described herein.

The present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, performing physical optimization of block and wire placement, partitioning blocks into cores and/or shells, synthesizing shells and cores, recombining the cores and shells into blocks, estimating block sizes, determining pin assignment layouts, selecting wire layers, minimizing delays in wires by inserting buffers at optimal distances, determining a proportion of time to assign to each shell on each side of a wire, optimization of blocks and wires and partitioning the blocks is incrementally repeated if the wire delays are too long for shell synthesis, recombining the shells and cores, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method for synthesizing an integrated circuit design, the method comprising:
   performing a physical optimization of a block and wire placement, before performing a logic synthesis;
   partitioning the blocks into cores and shells;
   synthesizing the shells and cores; and
   recombining the cores and shells into blocks
   wherein:
   a core comprises logic in a block bounded by registers; and
   a shell comprises logic between a core and pins of a block.

2. The method of claim 1, wherein performing physical optimization of block placement comprises estimating an area of each block.

3. The method of claim 2, wherein performing physical optimization of wire placement comprises determining a pin assignment layout.

4. The method of claim 3, wherein performing physical optimization of wire placement further comprises selecting a layer for each wire based on wire length.

5. The method of claim 4, wherein performing physical optimization of wire placement further comprises minimizing a delay in each wire by inserting buffers at optimal distances.

6. The method of claim 5, wherein synthesizing the shells comprises determining a proportion of time to assign to each shell on each side of a wire.

7. The method of claim 5, wherein after synthesizing the shells, the process of performing physical optimization of blocks and wires and partitioning the blocks is incrementally repeated if the wire delays are too long for shell synthesis.

8. The method according to claim 1, wherein the method is codified as instructions on a computer readable media, that, when loaded into a computer, cause the computer to perform the steps of the method.

9. A method for designing deep sub-micron integrated circuits, the method comprising:
performing a layout of physical blocks by estimating an area for each block;
connecting pins of the blocks with no timing constraints;
assigning each wire to a metal layer pair;
optimizing the speed of each wire for its respective layer;
partitioning the blocks into cores comprising logic in a block bounded by registers and shells comprising logic between a core and pins of the block;
synthesizing the shells;
synthesizing the cores; and
recombining the shells and cores.

10. The method of claim 9, wherein each wire is assigned to a metal layer based on a relative length of the wire.

11. The method of claim 10, wherein optimizing the speed of each wire comprises minimizing a delay in each wire by inserting buffers at optimal distances.

12. The method of claim 11, wherein synthesizing the shells comprises determining a proportion of time to assign to each shell on each side of a wire.

13. The method of claim 12, wherein after synthesizing the shells, the layout procedure is incrementally repeated if the wire delays are too long for shell synthesis.

14. A method for reducing a design cycle time for integrated circuits, the method comprising:
laying out blocks by estimating an area for each block;
minimizing a delay in each global wire;
partitioning each block into a core of logic bounded by registers and a shell of logic between the core and pins of the block;
performing a logic synthesis on each shell by utilizing a known delay for each wire;
performing logic synthesis on each core; and
recombining the shells and cores.

15. The method of claim 14, wherein minimizing a delay in each global wire comprises assigning each wire to a layer, and inserting buffers at optimal distances.

16. The method of claim 15, wherein performing logic synthesis on each shell comprises determining a proportion of time to assign to each shell on each side of a wire.

17. The method of claim 16, wherein after synthesizing the shells, the layout procedure is incrementally repeated if the wire delays are too long for shell synthesis.

18. A method for synthesizing an integrated circuit design, the method comprising:
performing a physical optimization of a block and wire placement, before performing a logic synthesis;
partitioning the blocks into cores and shells;
synthesizing the shells and cores; and
recombining the cores and shells into blocks;
wherein:
performing the physical optimization of the wire placement comprises determining a pin assignment layout;
performing the physical optimization of the wire placement further comprises selecting a layer for each wire based on wire length;
performing the physical optimization of the wire placement further comprises minimizing a delay in each wire by inserting buffers at optimal distances;
each wire is overdesigned in that it is designed to be as fast as possible at the earliest stages of design and wire changes related to wire speed in subsequent design stages comprise area recovery by dropping repeaters that are not absolutely necessary; and
synthesizing the shells comprises determining a proportion of time to assign to each shell on each side of a wire wherein each core is logic bounded by registers in a block and each shell is logic between a core and pins of a block.

19. The method according to claim 18, wherein the step of performing physical optimization of block and wire placement is performed without concern for wire delays.

20. The method according to claim 18, wherein the only estimation utilized in the method is a block size estimation, and the block size is adjusted and the method is re-iterated based on the adjusted block size.

21. The method according to claim 18, further comprising the steps of connecting pins without timing constraints, and assigning layers to wires qualitatively based on wirelength without regard to timing.

22. The method according to claim 18, wherein the entire design process is performed without iterations due to timing constraints of any wires.

23. The method according to claim 18, wherein wire changes related to wire speed in subsequent design stages comprise one of changing layers of the wires and area recovery performed by dropping buffers that are not absolutely necessary.

* * * * *